US012637751B2

(12) United States Patent
Hamashima et al.

(10) Patent No.: US 12,637,751 B2
(45) Date of Patent: May 26, 2026

(54) TUNGSTEN-BASED THERMAL SPRAY COATING AND MATERIAL FOR THERMAL SPRAYING TO OBTAIN IT

(71) Applicant: TOCALO CO., LTD., Kobe (JP)

(72) Inventors: Kazuo Hamashima, Kobe (JP);
Masashi Morisasa, Kobe (JP);
Shinsuke Anai, Kobe (JP)

(73) Assignee: TOCALO CO., LTD., Kobe (JP)

( * ) Notice: Subject to any disclaimer, the term of this patent is extended or adjusted under 35 U.S.C. 154(b) by 762 days.

(21) Appl. No.: 17/796,886

(22) PCT Filed: Mar. 4, 2021

(86) PCT No.: PCT/JP2021/008344
§ 371 (c)(1),
(2) Date: Jan. 18, 2023

(87) PCT Pub. No.: WO2021/177393
PCT Pub. Date: Sep. 10, 2021

(65) Prior Publication Data
US 2023/0220531 A1     Jul. 13, 2023

(30) Foreign Application Priority Data

Mar. 6, 2020     (JP) ................................. 2020-038841

(51) Int. Cl.
*C23C 4/06*          (2016.01)
*C22C 27/04*         (2006.01)
(Continued)

(52) U.S. Cl.
CPC ................ *C23C 4/06* (2013.01); *C22C 27/04* (2013.01); *H01J 37/32495* (2013.01); *C23C 4/134* (2016.01); *H01J 2237/334* (2013.01)

(58) Field of Classification Search
None
See application file for complete search history.

(56) References Cited

U.S. PATENT DOCUMENTS

2007/0227299 A1* 10/2007 Marchiando ........ C04B 35/5611
75/244
2017/0314613 A1* 11/2017 Yasuo ....................... C23C 4/10
(Continued)

FOREIGN PATENT DOCUMENTS

JP          H09-95764 A      4/1997
JP          2007250569 A     9/2007
(Continued)

OTHER PUBLICATIONS

JP2018059174—machine translation, Kimura et al , published Apr. 12, 2018.*
(Continued)

*Primary Examiner* — Xiaobei Wang
(74) *Attorney, Agent, or Firm* — Element IP, PLC

(57)                    ABSTRACT
To provide a new tungsten-based thermal spray coating suitable as e.g. a component for plasma etching device using halogen gas, and a material for thermal spraying for obtaining the thermal spray coating.
A thermal spray coating characterized by containing tungsten as a matrix phase and oxides containing silicon and boron as a dispersed phase, and a component for plasma etching device having such a thermal spray coating. A material for thermal spraying characterized by containing from 1 to 7 wt % of silicon, from 0.5 to 3 wt % of boron and the reminder being tungsten and unavoidable impurities, and a method for producing a thermal spray coating by thermally spraying the material for thermal spraying.

11 Claims, 2 Drawing Sheets

(51) Int. Cl.
   *H01J 37/32*      (2006.01)
   *C23C 4/134*      (2016.01)

(56) References Cited

U.S. PATENT DOCUMENTS

2017/0335442 A1*   11/2017   Brupbacher ............... C23C 4/08
2019/0211434 A1*   7/2019   Espallargas ............. C23C 18/08

FOREIGN PATENT DOCUMENTS

| | | |
|---|---|---|
| JP | 2011528755 A | 11/2011 |
| JP | 2012508467 A | 4/2012 |
| JP | 2012508684 A | 4/2012 |
| JP | 2014009361 A | 1/2014 |
| JP | 2018048378 A | 3/2018 |

OTHER PUBLICATIONS

English translation of the International Preliminary Report on Patentability and Written Opinion issued Sep. 6, 2022 in PCT/JP2021/008344, 4 pages.

Christian Moreau et al, "Thermal diffusivity of plasma-sprayed tungsten coatings", Surface and Coatings Technology, 61, 1993, pp. 67-71.

Hyun-Ki Kang, "Thermal properties of plasma-sprayed tungsten deposits", Journal of Nuclear Materials, 335, 2004, pp. 1-4.

International Search Report issued May 18, 2021 in PCT/JP2021/008344 (with English translation), 6 pages.

\* cited by examiner

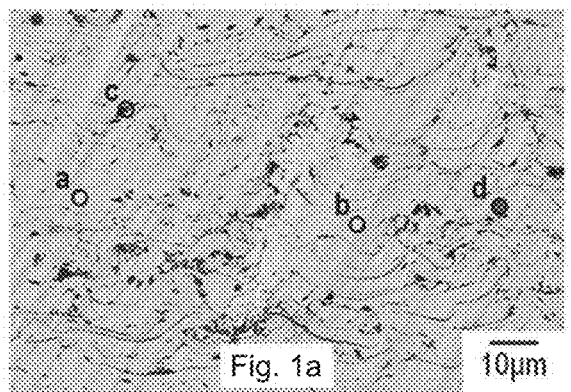
Fig. 1a 10μm
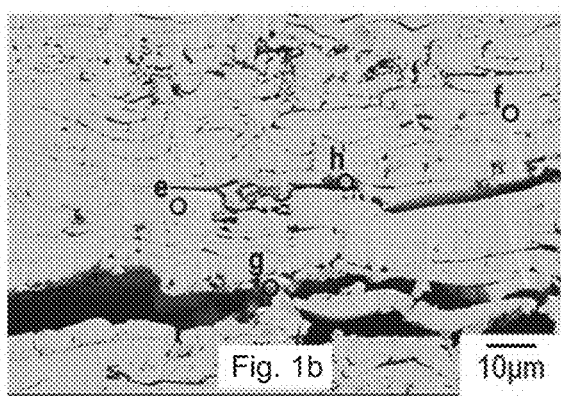
Fig. 1b 10μm
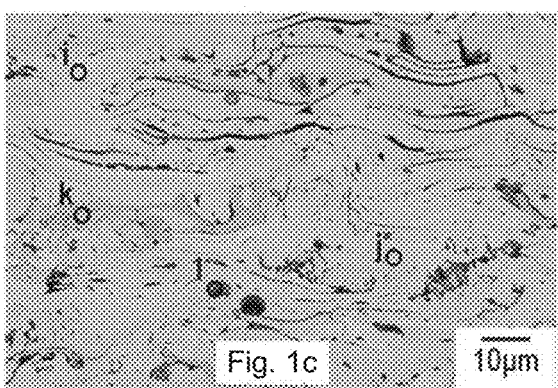
Fig. 1c 10μm

TUNGSTEN-BASED THERMAL SPRAY COATING AND MATERIAL FOR THERMAL SPRAYING TO OBTAIN IT

TECHNICAL FIELD

The present invention relates to a new tungsten-based thermal spray coating suitable as e.g. a component for plasma etching device using halogen gas, and a material for thermal spraying to obtain such a thermal spray coating.

BACKGROUND ART

Plasma etching in the semiconductor production process is employed in the step of fabricating a circuit on a wafer. Before initiating plasma etching, the wafer is coated with a photoresist or hard mask (usually an oxide or nitride) and exposed to a circuit pattern during photolithography, Plasma etching removes only the material after tracing the pattern, and this patterning and etching sequence is repeated multiple times in the semiconductor chip production process. Plasma etching removes the material not only through the physical sputtering effect, but also through the chemical sputtering effect by exposing the wafer to plasma using a halogenated gas of fluorine-type or chlorine-type.

In plasma etching, in order to form today's highly integrated semiconductor circuits, it is necessary to create nearly vertical profiles, whereby high-energy ions and radicals are emitted from the plasma at high densities. Therefore, not only the wafers to be etched but also the materials constituting the inner surface of the chamber in which etching is conducted, will be affected and worn away by plasma irradiation. The products thus formed, will adhere to the circuitry of the wafer and will thus cause a factor to reduce the yield in the semiconductor chip production.

The materials to constitute the chamber in which the above plasma etching is conducted, are usually metallic materials such as aluminum alloys, which are not high in resistance to exposure to halogen gas plasma. In contrast, ceramic materials such as metal oxides are expected to show good durability against exposure to plasma because of their complex crystal structure and high chemical stability. In Patent Document 1, a method is proposed for depositing a thin film of aluminum oxide on the inner surface of a quartz viewing window of a reaction tank in a CVD device using plasma, by a sputtering method, to suppress damage to the window.

In Patent Document 2, it is disclosed that a coating film of aluminum oxide or yttrium oxide is deposited on the inner wall of a plasma etching chamber by a thermal spraying method or the like to suppress dust emission due to wear and to improve the yield in the production of semiconductor chips in the plasma etching process. Furthermore, in Patent Document 3, it is proposed to select the deposition material in thermal spraying from compounds of various lanthanoids and iridium for the same purpose. Further, in many cases, as the plasma gas, a gas containing oxygen or fluorine as the main chemical reaction source, is used, and thus, Patent Documents 4 and 5 disclose that oxyfluoride of a rare earth metal such as yttrium is effective as a protective coating.

In recent years, semiconductors to be used in advanced technology fields have become more and more integrated, and the line widths of circuits to be formed on chips are becoming narrower and narrower at an accelerating rate. Therefore, the allowable size of dust in the etching process has been reduced to at most a few tens nm level, and the number of allowable dust particles is also required to be minimized. In contrast, ceramic coatings containing oxyfluorides of rare earth metals, such as those mentioned above, do not fully meet these requirements because they are depleted to a certain degree by plasma exposure. Furthermore, in Patent Documents 6 and 7, as a surface modification material for the chamber components, a silicon material identical to the wafer material is proposed, which generates a fluoride that volatilizes at room temperature when exposed to a gas plasma containing fluorine, and this fluoride can be exhausted out of the chamber by exhaust. However, the silicon material wears out quickly, requiring frequent recoating, and many other practical problems remain.

PRIOR ART DOCUMENTS

Patent Documents

Patent Document 1: JP-A-H09-95764
Patent Document 2: JP-A-2011-528755
Patent Document 3: JP-A-2012-508467
Patent Document 4: JP-A-2012-508684
Patent Document 5: JP-A-2014-009361
Patent Document 6: JP-A-2007-250569
Patent Document 7: JP-A-2018-48378

DISCLOSURE OF INVENTION

Technical Problem

To solve those problems as described above, it is an object of the present invention to provide a new thermal spray coating suitable as a material that can effectively suppress the generation of dust resulting from physical sputtering and fluorination reactions that occur when the equipment materials comprising a chamber for plasma etching using halogen gas such as fluorine gas in the above-mentioned semiconductor production process, are exposed to plasma, a thermal spraying material to obtain such a thermal spray coating, and a method for producing a thermal spray coating from such a thermal spraying material.

Solution to Problem

The present inventors have conducted diligent research to achieve the above object and have arrived at the present invention, which can accomplish the object.

That is, the present inventors have focused on tungsten as a thermal spraying material for the above purpose, as a material whose fluoride is volatilized and easily discharged even if it reacts with fluorine gas plasma in the room temperature range, similar to silicon materials. Since tungsten has extremely high density, they thought that its wear rate by physical sputtering would also be low. However, C. Moreau et. al, "Thermal diffusivity of plasma-sprayed tungsten coating", Surface and Coating technology, 61(1993), pp. 67-71, reveals that thermal spraying in air with tungsten raw material inevitably produces a large number of cracks in the coating, that open parallel to the interface with the substrate, and that the thermal diffusivity of the thermal spray coating is much smaller than that of the bulk material.

Further, H. K. Kang, "Thermal properties of plasma-sprayed tungsten deposits," J. of Nuclear Mate. 335(2004), pp, 1-4, clarifies that the extremely high melting point of tungsten and its poor oxidation resistance cause the easy formation of oxides during thermal spraying, which is the cause of cracking. The oxides of tungsten are not stable and sublimate at relatively low temperatures, and because of their fragility, thermal spray coatings containing tungsten oxides are extremely brittle films with low mechanical properties, which may easily cause delamination of thin layers due to changes in surface temperature when exposed to plasma.

The present inventors have found that when the thermal spray material contains not only tungsten but also boron and silicon together with tungsten, the obtainable thermal spray coating is less likely to produce reaction products that become residues when exposed to plasma gases containing fluorine and oxygen.

That is, boron and silicon in the thermal spraying material are more easily oxidized than tungsten, but unlike tungsten oxides, they can form a protective film that prevents oxygen from entering the inside of the molten particles. In particular, boron has a low oxidation initiation temperature, and the formed boron oxide will melt at a temperature of at most 500° C. to form an oxidation protective film on the tungsten-based particles. Specifically, when a material containing boron and silicon along with tungsten is sprayed in air, the oxidation of boron is followed by the oxidation of silicon to form silicon oxide. And, the silicon oxide is then readily associated with the boron oxide, raising the melting point while maintaining the glassy state, which is considered to prevent the oxidation protective film from scattering during particle flight.

The thermal spray coating thus prepared has tungsten as the matrix phase and becomes to be a structure in which oxides containing boron and silicon are dispersed. The oxides containing boron and silicon will form a glass phase with a low softening point that has good wetting to tungsten, whereby there will be almost no cracking of the matrix during solidification.

Thus, the present invention has the following embodiments.

(1) A thermal spray coating containing tungsten as the matrix phase and oxides containing silicon and boron as the dispersed phase.

(2) The thermal spray coating according to (1), wherein the volume ratio of the dispersed phase is from 2 to 6% to the total amount of the matrix phase and the dispersed phase.

(3) The thermal spray coating according to (1) or (2), wherein the matrix phase contains silicon and/or boron.

(4) The thermal spray coating according to any one of (1) to (3), wherein the dispersed phase contains tungsten.

(5) The thermal spray coating according to any one of (1) to (4), wherein the thickness is from 50 to 1,000 μm.

(6) A component for a plasma etching device having a thermal spray coating as defined in any one of (1) to (5).

(7) The component for a plasma etching device according to (6), wherein the plasma etching device is a dry etching device using fluorine-containing gas plasma.

(8) A material for thermal spraying characterized by containing from 1 to 7 wt % of silicon, from 0.5 to 3 wt % of boron, and the remainder being tungsten and unavoidable impurities.

(9) The material for thermal spraying according to (8), which contains from 2 to 5 wt % of silicon and from 1.5 to 3 wt % of boron.

(10) The material for thermal spraying according to (8) or (9), which contains tungsten, silicon and boron mainly as a tungsten-silicon-boron ternary compound represented by $W_5Si_xB_y$ (where x is from 0.8 to 1.7, and y is from 1.3 to 2.2).

(11) The material for thermal spraying according to (10), wherein the tungsten-silicon-boron ternary compound is a compound represented by $W_5SiB_2$ and/or $W_5Si_{1.5}B_{1.5}$.

(12) The material for thermal spraying according to any one of (8) to (11) for producing a thermal spray coating as defined in any one of (1) to (5).

(13) A method for producing a thermal spray coating, which comprises thermal spraying the material for thermal spraying as defined in any one of (8) to (12).

(14) The method for producing a thermal spray coating according to (13), wherein the material for thermal spraying is thermally sprayed by atmospheric plasma spraying.

(15) The method for producing a thermal spray coating according to (13) or (14), which produces a thermal spray coating as defined any one of (1) to (5).

Advantageous Effects of Invention

According to the present invention, there is provided a thermal spray coating that can suppress dust to be generated during the process, which is suitable for forming in e.g. a chamber to be subjected to dry etching by fluorine-containing gas plasma. Further, according to the present invention, there is provided a thermal spray material to obtain the above thermal spray coating, particularly by atmospheric plasma spraying.

Furthermore, according to the present invention, there is provided a material suitable as a component for plasma etching device such as a chamber to be subjected to dry etching by fluorine-containing gas plasma.

BRIEF DESCRIPTION OF DRAWINGS

FIG. 1a is the cross-sectional microstructure of the coating in Example 1 and the locations (a, b, c, d) where component analysis was performed.

FIG. 1b is the cross-sectional microstructure of the coating in Comparative Example 1 and the locations (e, f, g, h) where component analysis was performed.

FIG. 1c is the cross-sectional microstructure of the coating in Comparative Example 2 and the locations (i, j, k, l) where component analysis was performed.

DESCRIPTION OF EMBODIMENTS (Thermal Spray Coating)

Figure 2:
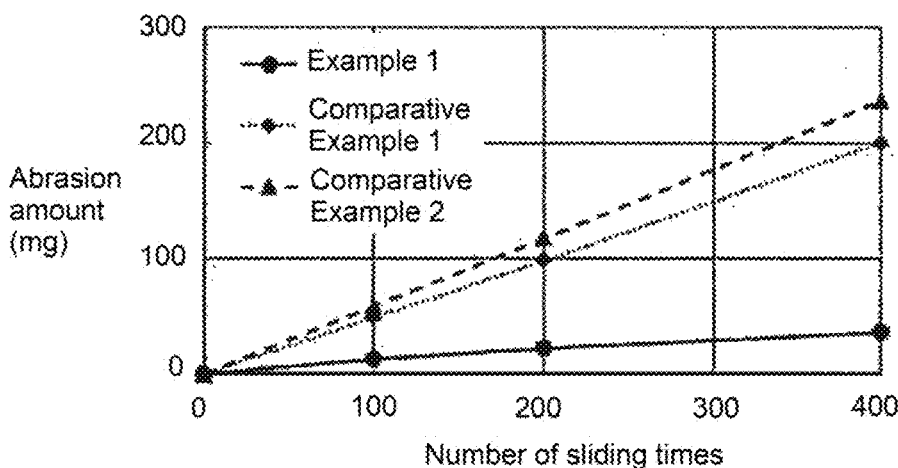
FIG. 2 shows the results of the Suga Abrasion Tests with respect to the thermal spray coatings in Example 1 and Comparative Examples 1 and 2.

The thermal spray coating of the present invention contains tungsten as the matrix phase (hereinafter simply referred to also as the matrix), and oxides containing silicon and boron as the dispersed phase.

Tungsten, which forms the matrix being the main constituent phase of the thermal spray coating of the present invention, has a large specific gravity and is known as a metal having the highest atomic binding energy, making it very resistant to physical spattering. Further, the boiling point of tungsten hexafluoride being a compound of tungsten and fluorine, is 17.5° C., and it volatilizes at the temperature at which dry etching of semiconductors is conducted.

Tungsten being the matrix in the thermal spray coating may contain silicon and/or boron. In such a case, silicon and/or boron can be solid-solubilized in tungsten, or may be dispersed as fine tungsten silicide or tungsten boride. Silicon, like tungsten, is a component whose reaction product with fluorine vaporizes at room temperature or lower, and boron is also a component that easily volatilizes, whereby they do not interfere with the features of tungsten as a plasma-resistant protective coating material.

When the above matrix contains silicon, the content of silicon is preferably at least 0.2 atom % to the total amount of the matrix, while at most 15 atom % is preferred and at most 10 atom % is more preferred.

When the above matrix contains boron, the content of boron is preferably at least 0.5 atom % to the total amount of the matrix, while at most 20 atom % is preferred and at most 15 atom % is more preferred. The inclusion of silicon and/or boron in tungsten improves the mechanical properties such as hardness of the coating, but if the above range is exceeded, the wear rate to the plasma will increase.

In a thermal spray coating formed from a thermal spraying material consisting only of tungsten, a part of the sprayed material will be usually oxidized and an extremely unstable tungsten oxide will be formed before the molten spray droplets are laminated on the substrate material. Since this tungsten oxide is brittle, large cracks parallel to the substrate interface will be formed in the coating due to thermal stresses generated during cooling. When cracks are formed, thermal or mechanical stresses will be generated in the thermal spray coating, causing internal cracks to develop in the coating and surface areas of the coating to chip off.

On the other hand, in a thermal spray coating formed from a thermal spraying material containing silicon and boron together with tungsten, the amount of tungsten oxide which is brittle as mentioned above, is small, and the particle size is also small. As a result, the obtained thermal spray coating does not easily develop large-scale cracks or partial chips even when subjected to thermal or mechanical stress.

The oxides containing silicon and boron to be contained as the dispersed phase in the thermal spray coating of the present invention tend to eutecticize, form a glass phase at a large cooling rate during thermal spray deposition, and often exist as irregularly shaped particles with an average particle size of at most 100 µm. The bonding between the tungsten matrix and the glass phase which is composed of oxides containing silicon and boron, is good, and no cracks or pores will form at the interface. Further, the softening temperature of the glass phase composed of oxides containing silicon and boron is relatively low, and when thermal stress is added due to an increase in the coating surface temperature during thermal spray deposition or plasma exposure, the glass phase can soften and decrease the stress.

The content of the dispersed phase in the thermal spray coating of the present invention is preferably at least 2% and at most 8% by volume to the total amount of the matrix and the dispersed phase. If the volume ratio of the dispersed phase is less than 2%, the remaining tungsten oxide will increase and it will be difficult for the dispersed phase to function as a destressing phase. On the other hand, if the volume ratio of the dispersed phase exceeds 8%, the physical spatter resistance of the entire coating will be greatly reduced. Particularly, the content of the dispersed phase, by volume, is more preferably at least 3%, and more preferably at most 6%.

The above dispersed phase is preferably a binary system consisting of oxides of silicon and boron, but may also contain oxides of tungsten and/or rare earth elements. The rare earth elements here may be scandium, yttrium, lanthanum, cerium, neodymium, samarium, gadolinium, erbium, ytterbium, rutetium, etc.

In a case where tungsten is contained in the dispersed phase, the content of tungsten is preferably at least 3 atom % to the total amount of the dispersed phase, while at most 30 atom % is preferred and at most 25 atom % is more preferred. Further, the content of rare earth elements is preferably from 1 to 6 atom %, more preferably from 2 to 4 atom %, to the total amount of the dispersed phase. By adding appropriate amounts of tungsten and rare earth elements to the dispersed phase, it is possible to adjust its glass transition temperature and softening temperature.

The thermal spray coating of the present invention is preferably from 50 to 1,000 µm, more preferably from 100 to 500 µm, in thickness. Although a thermal spray coating with a thickness in such a range can be easily obtained in the present invention, a thermal spray coating with such a thickness is suitable as a protective coating covering a component of a chamber to be subjected to plasma dry etching of semiconductors containing fluorine. This is because the protective coating, which is inevitably exposed to plasma, must be resistant to both physical and chemical sputtering. Since a damage to the protective coating by plasma will be a cause of microdefects in semiconductor products, the requirements for the protective coating have become much more demanding as semiconductor integration has increased. One of the coatings that satisfy these requirements is a coating that has high resistance to physical sputtering, and even if physical sputtering causes wear and tear, the wear and tear will react with halogen components to form a gas that can be easily discharged. The thermal spray coating of the present invention can fully satisfy the above requirement.

(Thermal Spraying Material)

The thermal spray coating of the present invention will be produced by spraying a thermal spraying material containing tungsten, silicon and boron. The thermal spraying material is preferably in a powder or particle form. The thermal spraying material may be a single compound, a compound consisting of several elements, or a metal powder, or a combination of several of these may be selected.

As the thermal spraying material to form the thermal spray coating, it is possible to use one in which individual powders of tungsten, silicon and boron are mixed, to achieve the contents in the obtainable thermal spray coating. The thermal spraying material is not limited to a mixed powder, and it is possible to use a binary compound powder of silicon disilicide as the silicon source and tungsten boride as the boron source. Further, it is possible to use a ternary compound powder of tungsten-silicon-boron. Furthermore, it is possible to use a mixture of these compounds and/or mono-elemental powders.

The thermal spraying material in the present invention contains silicon and boron, while tungsten being main. In particular, in order to bring the volume ratio of the glass phase containing oxides of silicon and boron in the obtainable thermal spray coating, to be from 2 to 8% to the total of the matrix and glass phase, the silicon content in the thermal spraying material is made to be preferably from 1 to 7 wt %, more preferably from 2 to 5 wt %, and the boron content is made to be preferably from 0.5 to 3 wt %, more preferably from 1.5 to 3 wt %.

If the silicon content is less than 1 wt %, the glass phase dispersed in the coating after thermal spray deposition becomes small, making it difficult to achieve the desired effect. On the other hand, if the silicon content exceeds 7 wt %, brittle tungsten silicide will be precipitated in a large amount in the coating after thermal spray deposition, whereby cracking and foil delamination of the coating will be likely to occur. On the other hand, if the boron content exceeds 3 wt %, brittle tungsten boride will be precipitated in a large amount of in the coating after thermal spray deposition, whereby the coating is prone to cracking and foil delamination. Further, if the boron content is less than 0.5 wt %, the glass phase dispersed in the coating after thermal spray deposition becomes less, whereby the effect cannot be achieved.

As the thermal spraying material in the present invention, in order to obtain macroscopic uniformity of the thermal spray coating, a powder of a ternary compound of tungsten-silicon-boron is preferred. In particular, as the ternary compound, one having the composition of $W_5Si_xB_y$ is preferred. Here, x is preferably from 0.8 to 1.7, more preferably from 0.9 to 1.6, and y is preferably from 1.3 to 2.2, more preferably from 1.4 to 2.1. $W_5Si_{1.5}B_{1.5}$, or $W_5SiB_2$ is particularly preferred.

(Method for Producing Thermal Spray Coating)

The thermal spray coating of the present invention may be produced by a known thermal spraying method using the above-described thermal spraying material, but preferably, it may be produced by the following procedure.

The compound powders and/or metal powders, etc., being the above mentioned thermal spraying material for the thermal spray coating, are respectively weighed and mixed and ground in an organic solvent such as an alcohol by using a rotary ball mill or vibrating ball mill. These raw material powders are preferably as pure and fine as possible in order to obtain a thermal spray coating with excellent properties. In particular, in order to secure the homogeneity of the obtainable thermal spray coating, the average particle diameter (D50) of the compound powders is preferably at most 10 μm, more preferably at most 5 μm, particularly preferably from 1 to 3 μm.

The raw material powders ground and mixed by a rotary ball mill or vibrating ball mill may be used as a thermal spraying material as they are, but preferably by using an organic binder, it is preferred to conduct granulation treatment by using a spray dryer or the like in a non-oxidizing atmosphere. As the organic binder, it is preferred to select one that can be easily removed during sintering, and it is possible to use an acrylic resin, polyethylene glycol, etc.

The granulated powder is generally spherical in shape and has good flowability, but in order to make it strong enough to withstand transport by pressurized gas, etc., the granulated powder is calcined in a non-oxidizing atmosphere such as argon preferably from 1,000 to 1,800° C., more preferably from 1,200 to 1,600° C. This removes the organic binder and allows the primary particles within the granulated powder to sinter with one another while maintaining their spherical shape. When the granulated powder is then crushed, it becomes generally spherical and will not easily be collapsed even when transported by pressurized gas.

The resulting sintered granulated powder is used as a thermal spraying raw material after it is preferably classified to have the desired particle size. The average particle diameter (D50) of the thermal spraying raw material powder is preferably from 10 to 100 μm, more preferably from 15 to 75 μm. Argon, nitrogen, helium, hydrogen, etc, may be used as the working gas of the plasma. Among them, it is preferred to use a mixed gas of argon-hydrogen, nitrogen-hydrogen, or the like, by taking advantage of the characteristics of the respective gases. The thermal spraying output, defined as the product of the working voltage and the working current, may be selected within the range of from 20 to 100 kW, according to the type and size of the thermal spraying material and base material. Further, the spraying distance being the distance between the plasma gun and the sprayed object, is preferably set within a range of from about 50 mm and to about 200 mm depending on the thermal spraying material, spraying conditions, etc.

The thermal spraying method to be used in the present invention is preferably a thermal spraying method using plasma, such as an atmospheric plasma spraying method or a reduced pressure plasma spraying method, and particularly, atmospheric plasma spraying method is preferable.

EXAMPLES

In the following, the present invention will be specifically described with reference to Examples, but the present invention should not to be construed as limited to these Examples.

The atmospheric plasma spraying device and spraying conditions used in the following Examples and Comparative Examples are as follows.

Thermal spraying device: manufactured by Sulzer Metco, 9 MB

Operating voltage: 65V

Operating current: 700 A

Primary gas (Ar) flow rate: 60 NL/min

Secondary gas ($H_2$) flow rate: 5 NL/min

Thermal spraying distance: 140 mm

Example 1

Tungsten powder (manufactured by Japan New Metals Co., Ltd., particle size: 1.5 to 2.0 μm), tungsten boride powder (manufactured by Japan New Metals Co., Ltd., particle size: 3 to 6 μm) and tungsten silicide powder (manufactured by Japan New Metals Co., Ltd., particle size: 2 to 5 μm) are respectively weighed so as to be the following predetermined contents, and using ethanol as a solvent, mixed and ground by using a rotary ball mill, to prepare a slurry. Using this slurry as raw material, granulation treatment was conducted by using a spray dryer, followed by heating to 1,600° C. in argon gas to prepare a porous spherical powder containing 3.5 wt % of silicon, 2.5 wt % of boron and unavoidable impurities. The grain size of this spherical powder was from 15 to 75 μm.

The spherical powder prepared above was used as a thermal spraying material, and was applied to one surface (surface roughness Ra: 2 to 5 μm) roughened by sandblasting, of each of the following two substrates X and Y made of aluminum alloy (A5052), by the above-described atmospheric plasma spraying device under the above-described conditions; to form a thermal spray coating with a thickness of about 0.2 mm. Here, the above two substrates X and Y were, respectively, square shapes of [50 mm in length, 50 mm in width, and 3 mm in thickness] and [20 mm in length, 20 mm in width, and 5 mm in thickness].

Cross-sectional observation and component analysis of the thermal spray coating formed on the above substrate X (thermal spray sample) were conducted. The cross-section was exposed by using a cross-section polisher (manufactured by JEOL, SM-09010), and the cross-section was observed by using a field emission scanning electron microscope (manufactured by JEOL, JSM-7200F), and at the same time, an analysis of the components was conducted by an energy dispersive X-ray analysis (EDX).

In FIG. 1a; the cross-sectional microstructure of the thermal spray coating and the locations (a, b, c and d) where the composition was analyzed, are shown. The cross-section is a structure having dispersed particles disposed in a matrix structure, and as shown in Table 1, the composition (unit: atom %, the same applies hereafter) of the matrix (analysis locations a and b) was from 87 to 89% of tungsten, from 3 to 8% of boron, and from 5 to 8% of oxygen, and the dispersed phase (analysis locations c and d) was from 4 to 20% of tungsten, from 12 to 21% of silicon, and from 15 to 16% of boron and from 53 to 59% of oxygen.

TABLE 1

| | Analysis | Components (atomic %) | | | |
|---|---|---|---|---|---|
| | locations | W | O | Si | B |
| FIG. 1a | a | 87 | 5 | 0 | 8 |
| | b | 89 | 8 | 0 | 3 |
| | c | 20 | 53 | 12 | 15 |
| | d | 4 | 59 | 21 | 16 |

On the other hand, the above substrate Y (thermal spray sample) was ultrasonically cleaned in pure water, dried in a thermostatic chamber maintained at 85° C., and then evaluated for ease of particle detachment from the film due to mechanical stress by the Suga abrasion test method as follows. The surface of the thermal spray sample subjected to this test was left as sprayed without conducting polishing, etc.

In the Suga abrasion test, the thermal sprayed surface of a flat specimen is pressed against the outer circumference of a disc covered with abrasive paper under a constant load while sliding back and forth. The abrasive grains of the abrasive paper will scratch the sprayed surface, and therefore, if there are open cracks or other openings, the sprayed film will be significantly worn away. The test was conducted by using abrasive paper consisting of #180 SiC abrasive grains and a pressing force of 151. FIG. 2 shows the test results, whereby it is apparent that the increase in the amount of wear of the coating in Example 1 to the number of sliding times is very slow, and the abrasion amount is much less than that of the samples in Comparative Examples 1 and 2 as described below.

Figure 3:
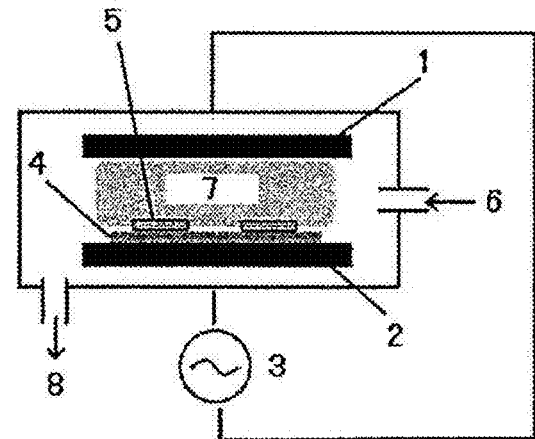
FIG. 3 shows a schematic of the parallel plate type dry etching device used for the plasma exposure tests of the thermal spray coatings in Example 1 and Comparative Examples 1 and 2.

Further, the sprayed surface of the above substrate Y (thermal spray sample) was polished with #800 wet emery paper, ultrasonically cleaned in pure water, and then dried at 85° C. in a constant temperature oven, whereupon the specimen was subjected to a plasma exposure test. In the test, a parallel plate dry etching apparatus as shown in FIG. 3 was used, and the thermal spray sample was placed on a silicon wafer placed on the cathode side, so that the sprayed surface faced the anode, and exposed to plasma. Plasma was generated under two conditions: A, for evaluating resistance to chemical sputtering, and B, for evaluating resistance to physical sputtering, and the respective conditions are as follows.

Figure 4:
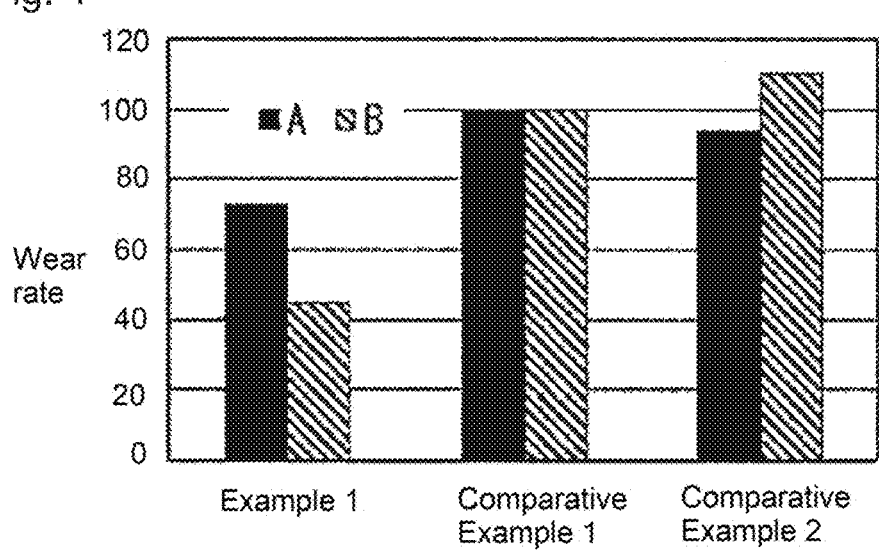
FIG. 4 shows the results of the plasma exposure tests of the thermal spray coatings in Example 1 and Comparative Examples 1 and 2.

Condition A:
    Plasma gas species and flow rates:
        $CF_4$: 50 sccm, $O_2$: 10 sccm,
        Ar: 50 sccm
        RF output: 800 W, Bias: 600 W
Condition B:
    Plasma gas species and flow rates:
        $O_2$: 10 sccm, Ar: 100 sccm
        RF output: 1,000 W, Bias: 1,000 W The results of the plasma exposure test are shown in FIG. 4, where the wear rate in Comparative Example 1 (described below) is shown as 100. The wear rate in Example 1 is small for both plasma conditions A and B, and its superiority is especially noticeable under the condition where the wear rate is mainly caused by physical sputtering.

Comparative Examples 1 and 2

In Comparative Example 1, as the thermal spraying material, powder (tungsten: 99.8 mass % and unavoidable impurities, particle size: 10 to 40 μm, W-L, manufactured by Japan New Metals Co., Ltd.) was used. In Comparative Example 2, powder (tungsten: 91.6 mass % and silicon: 8.4 mass %, $W_5Si_3$ compound (average particle diameter (D50): 12.5 μm, manufactured by Japan New Metals Co., Ltd.) was used. Then, by the atmospheric plasma spraying method under the same conditions as in Example 1, thermal spray coatings were, respectively, formed on the surfaces roughened by sandblasting, of two substrates X and Y having the same shapes as in Example 1.

Cross-sectional observation and component analysis of the thermal spray coatings in Comparative Examples 1 and 2, which were formed on the above substrate X (thermal spray sample), were conducted in the same manner as in Example 1. FIG. 1*b* shows the cross-sectional microstructure of the thermal spray coating and the locations (e, f, g, h) where component analysis was conducted in Comparative Example 1, and FIG. 1*c* shows the cross-sectional microstructure of the thermal spray coating and the locations (i, j, k, l) where component analysis was conducted in Comparative Example 2.

The thermal sprayed cross-section in Comparative Example 1 had a nearly uniform microstructure with many coarse cracks, as seen in FIG. 1*b*. Further, as shown in Table 2, the composition of the matrix (analysis locations e and f) was from 92 to 95% of tungsten and from 5 to 8% of oxygen, and the thin layers on the inner surface of the cracks (analysis locations g and h) were composed of from 17 to 22% of tungsten and from 78 to 83% of oxygen.

The thermal sprayed cross-section in Comparative Example 2 also had a nearly uniform microstructure with many coarse cracks, as seen in FIG. 1*c*, Further, as shown in Table 2, the composition of the matrix (analysis locations i and j) was from 93 to 96% of tungsten, and from 4 to 7% of oxygen, and the thin layers on the inner surface of the cracks (analysis locations k and l) were composed of from 12 to 20% of tungsten, from 65 to 73% of oxygen, and from 7 to 23% of silicon.

The results in Table 2 show that the thermal spray coatings in Comparative Examples 1 and 2 are composed of tungsten and tungsten oxide, and that coarse cracks are formed starting from the tungsten oxide.

TABLE 2

| | Analysis | Components (atomic %) | | | |
|---|---|---|---|---|---|
| | locations | W | O | Si | B |
| FIG. 1b | e | 95 | 5 | 0 | 0 |
| | f | 92 | 8 | 0 | 0 |
| | g | 17 | 83 | 0 | 0 |
| | h | 22 | 78 | 0 | 0 |
| FIG. 1c | i | 93 | 7 | 0 | 0 |
| | j | 96 | 4 | 0 | 0 |
| | k | 20 | 73 | 7 | 0 |
| | l | 12 | 65 | 23 | 0 |

Also with respect to substrate Y (thermal spray sample) having a thermal spray coating in Comparative Examples 1 and 2, ease of particle detachment from the coating due to mechanical stress, was evaluated by the Suga abrasion test method under the same conditions as the thermal spray coating in Example 1. FIG. 2 shows the test results, whereby it was found that the abrasion amount of the coating in Comparative Examples was from 5 to 6 times as compared to that of the Example.

Further, substrate X (thermal spray sample) having a thermal spray coating in Comparative Examples 1 and 2 was subjected to the same plasma exposure test as in Example 1. The results of the plasma exposure test are shown in FIG. 4 with the wear rate in Comparative Example 1 being 100. In both plasma conditions A and B above, the wear rate of substrate X is larger than that in Example 1, and in condition B, where the wear is mainly caused by physical sputtering, the difference is particularly noticeable.

INDUSTRIAL APPLICABILITY

The thermal spray coating is effective in a wide range of applications, including components for plasma dry-etching chambers that use halogen gases such as fluorine gas in the semiconductor production process.

In addition, the entire contents of the specification, claims, drawings, and abstract of Japanese Patent Application No. 2020-38841, filed on Mar. 6, 2020, are hereby cited and incorporated herein as the disclosure of the specification of the present invention.

REFERENCE SYMBOLS

1: Anode, 2: Cathode, 3: Power source, 4: Wafer,
5: Thermal spray sample, 6: Plasma gas, 7: Plasma, 8: Exhaust
a, b, c, d: Cross-sectional microstructure of the thermal spray coating in Example 1 (FIG. 1*a*) and locations where component analysis was conducted.
e, f, g, h: Cross-sectional microstructure of the thermal spray coating in Comparative Example 1 (FIG. 1*b*) and locations where component analysis was conducted.

i, j, k, l: Cross-sectional microstructure of the thermal spray coating in Comparative Example 2 (FIG. 1*c*) and locations where component analysis was conducted.

The invention claimed is:

1. A component for a plasma etching device, said component comprising a thermal spray coating comprising tungsten as a matrix phase and oxides comprising silicon and boron as a dispersed phase.

2. The component according to claim 1, wherein a volume ratio of the dispersed phase to the matrix phase and the dispersed phase is 2 to 6%.

3. The component according to claim 1, wherein the matrix phase further comprises silicon and/or boron.

4. The component according to claim 3, wherein the matrix phase comprises silicon, and wherein a content of silicon in the matrix phase is 0.2-15 atom % to the total amount of the matrix.

5. The component according to claim 3, wherein the matrix phase comprises boron, and wherein a content of boron in the matrix phase is 0.5-20 atom % to the total amount of the matrix.

6. The component according to claim 3, wherein the matrix phase comprises silicon and boron.

7. The component according to claim 6, wherein the matrix phase comprises silicon in the matrix phase in a content of 0.2-15 atom % to the total amount of the matrix, and boron in the matrix phase in a content of 0.5-20 atom % to the total amount of the matrix.

8. The component according to claim 1, wherein the dispersed phase further comprises tungsten.

9. The component according to claim 8, wherein the dispersed phase comprises 3-30 atom % tungsten to the total amount of the dispersed phase.

10. The component according to claim 1, wherein a thickness of the thermal spray coating is from 50 to 1,000 μm.

11. The component according to claim 1, wherein the plasma etching device is a dry etching device using fluorine-comprising gas plasma.

\* \* \* \* \*